United States Patent [19]

Matsumoto et al.

[11] Patent Number: 4,805,143
[45] Date of Patent: Feb. 14, 1989

[54] READ-ONLY MEMORY

[75] Inventors: Youichi Matsumoto, Kodaira; Ryuuji Shibata, Higashiyamato; Isamu Kobayashi; Satoshi Meguro, both of Tokyo; Kouichi Nagasawa, Kunitachi; Hideo Meguro, Tachikawa; Hisahiro Moriuchi, Tanashi; Masahiro Ogata, Akishima; Kikuo Sakai, Fussa; Toshifumi Takeda, Kodaira, all of Japan

[73] Assignees: Hitachi Ltd.; Hitachi VLSI Engineering Corp., both of Tokyo, Japan

[21] Appl. No.: 2,291

[22] Filed: Jan. 12, 1987

[30] Foreign Application Priority Data

Jan. 16, 1986 [JP] Japan .................................. 61-4912
Apr. 23, 1986 [JP] Japan .................................. 61-92179
Apr. 23, 1986 [JP] Japan .................................. 61-92180

[51] Int. Cl.$^4$ ............................................ G11C 17/00
[52] U.S. Cl. ..................................... 365/104; 365/210
[58] Field of Search ............... 365/104, 203, 210, 182, 365/184, 189

[56] References Cited

U.S. PATENT DOCUMENTS 4,287,571 9/1981 Chakravarti et al. ............... 365/104
4,388,705 6/1983 Sheppard ............................ 365/210
4,661,926 4/1987 Lee ..................................... 365/104

OTHER PUBLICATIONS

M. Nitta et al., "How to Use IC Memory", Sangyo Shuppan Kabushiki Kaisha, Sep. 30, 1977, pp. 72–78.
Electronics, May 31, 1983, pp. 50–51.

Primary Examiner—Joseph A. Popek
Attorney, Agent, or Firm—Antonelli, Terry & Wands

[57] ABSTRACT

A mask-programmed ROM includes depletion type load MOSFETs provided between data lines in a memory array and a power supply voltage, the MOSFETs having a ground potential of the circuit applied to their gates. Reading of data is carried out by an amplifying MOSFET which supplies a current to a selected data line through a depletion type MOSFET which is supplied at its gate with the circuit ground potential. Thus, bias voltages which are respectively applied to the data lines and a sense amplifier which receives a signal read out from a selected data line are made equal to each other, thereby achieving a high-speed read operation.

28 Claims, 6 Drawing Sheets

READ-ONLY MEMORY

BACKGROUND OF THE INVENTION

The present invention relates to a semiconductor memory. More particularly, the present invention relates to a technique which may effectively be used for, for example, a mask-programmed ROM (read-only memory) in which data is written by ion implantation of an impurity carried out through a gate electrode.

Parallel mask-programmed ROMs in which a storage MOSFET (Metal Insulator Semiconductor Field Effect Transistor) is formed in accordance with data to be stored at the intersection between a word line and a data line are known (see, e.g., "How to Use IC Memory", Matsuo Nitta and Ryoichi Oomote, Sept. 30, 1977, Sangyo Shuppan Kabushiki Kaisha, pp. 73 to 76).

As one of such Parallel mask-programmed ROMs, a mask-programmed ROM which is described in "Electronics", May 31, 1983, pp. 50 to 51, is known. In this MOS-ROM, after data lines made of aluminum film have been formed, an impurity is introduced into the channel regions of MOSFETs defining memory cells by means of ion implantation carried out through gate electrodes (and an intermediate insulator film). In this way, the threshold voltage of the individual MOSFETs is raised (or lowered), and data is thereby stored.

In the mask-programmed ROM of the type described above, data is written after the formation of data lines and source lines which is carried out near the end of the manufacturing process, which means that it is possible to reduce the time required to complete the production.

SUMMARY OF THE INVENTION

We examined the above-described prior art and have found that it involves the following problems.

The impurity is selectively implanted using a mask made of photoresist film. Openings in this photoresist mask are formed so as to have a larger size than that of channel regions to take into in consideration a possible misalignment of the mask. Consequently, the impurity may also be introduced into the main surfaces of source and drain regions which are adjacent to the channel region of selected MOSFETs. Since this introduction of the impurity is carried out with high energy, a crystal defect may be generated at the pn junction of the source and drain regions. The crystal defect cannot sufficiently be repaired since it is only possible to subject the defect portion to annealing at low temperature, i.e., about b 450° C. so as not to melt the aluminum data lines. As a result, when the gate voltage is 0, a leakage current which is dependent on the drain voltage flows through the Pn junction at the drain region. This leakage current, which flows from the drain region to the substrate, increases as the drain voltage becomes higher. Further, the leakage current increases as the time of use of the device increases, resulting in a reduction in the lifetime of the device. This phenomenon is noticeably found when a negative bias voltage is applied to the substrate.

Accordingly, it is an object of the present invention to provide a technique which enables a reduction of leak current attributable to the data write step in the production of a ROM.

It is another object of the present invention to provide a technique which enables extension of the lifetime of a ROM.

It is still another object of the present invention to provide a technique which enables a reduction in power consumed or dissipated in a ROM.

It is a further object of the present invention to provide a ROM which is able to perform a high-speed operation.

The above and other objects, novel features and advantages of the present invention will become clear from the following description taken in conjunction with the accompanying drawings.

A representative of the novel techniques disclosed in this application will briefly be explained below.

A voltage which is lower than a power supply voltage (operating voltage) is applied to a line, that is, the drain region of a MOS defines a memory cell. For , a depletion type MOSFET supplied at its gate with a ground potential is connected as a load to the data line.

By virtue of the above-described means, it is possible to reduce leakage current flowing through the pn junction at the drain region, so that the lifetime of the MOSFET can be extended. Further, it is possible to reduce the power consumption and prevent the occurrence of latch-up. In addition, since the potential of the data line can be stabilized by the above-described load means, it is possible to read out data at high speed.

DESCRIPTION OF THE PREFERRED EMBODIMENT

Figure 1:
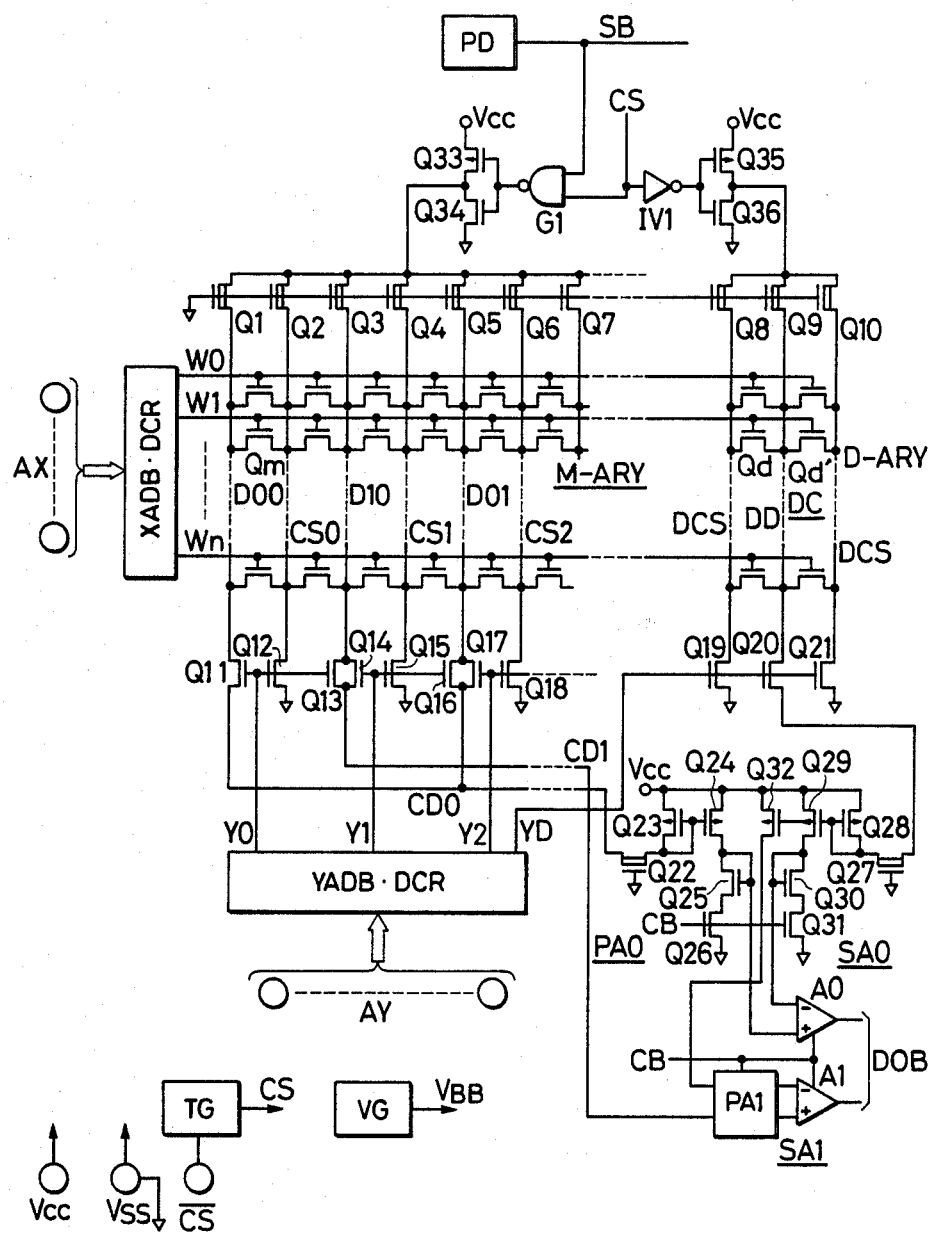
FIG. 1 is a circuit diagram of one embodiment of a mask-programmed ROM according to the present invention.

FIG. 1 is a circuit diagram of one embodiment of a mask-programmed ROM according to the present invention. This ROM is formed on a single semiconductor substrate such as a single crystal silicon by a known CMOS circuit manufacturing technique, although not necessarily, limited thereto. The ROM is fabricated on a semiconductor substrate defined by a single crystal P-type silicon, although not necessarily limited thereto. Each of the N-channel MOSFETs includes a source region and a drain region formed in the surface layer of the semiconductor substrate, and a gate electrode formed on the surface of a region (channel region) of the semiconductor substrate between the drain and source regions through a relatively thin gate insulator film. P-channel MOSFETs are formed in an N-type well region produced in the surface layer of the semiconductor substrate. Thus, the semiconductor substrate defines a common substrate gate for a plurality of N-channel MOSFETs which are formed thereon to constitute memory cells and peripheral circuits. Although not necessarily limited thereto, in this embodiment a negative bias voltage (substrate bias voltage $V_{BB}$ (e.g., $-3$ V) is applied to the semiconductor substrate. The bias voltage $V_{BB}$ is generated by a bias voltage generating circuit VG. Since the arrangement of the bias voltage generating circuit VG is the same as that of a known one, description thereof is omitted. The N-type well region defines a substrate gate for a P-channel MOSFET formed above it.

A memory array M-ARY comprises a plurality of word lines W0 to Wn which are arranged horizontally, a plurality of data lines (bit or digit lines) D00 to D01 which are arranged vertically and storage MOSFETs Qm which are respectively disposed at the intersections between the word and data lines (an exemplary arrangement of the memory array M-ARY is shown in FIG. 1).

In this embodiment, although not necessarily limited thereto, a common source line CS0 is provided between a pair of data lines D00 and D10 and extended in parallel with these data lines for the purpose of increasing the packing density of elements and lowering the power consumption during a read operation. The sources of storage MOSFETs Qm are connected in common to the common source line CS0 and the MOSFETs Qm being connected at their drains to the corresponding data lines D00 and D10, respectively. Further, the drain of a storage MOSFET Qm is connected to the data line D10, and the MOSFET Qm being connected at the source to a common source line CS1 which is adjacent to the data line D10. The drain of the other storage MOSFET Qm which is associated with the common source line CS1 is connected to the data line D01. To this data line D01 is connected in common the drain of a storage MOSFET Qm which is connected at the source to a common source line CS2 which is adjacent to the data line D01.

The data lines D and the common source lines CS are alternately disposed. Each of the data lines D except for the data line e.g. D00 at the end of the memory array is connected in common to the drains of two (two rows of) storage MOSFETs Qm which are disposed on both sides thereof and to which different Y addresses are allotted.

More specifically, the data line D00 is connected to a common data line CD0 through a MOSFET Q11 which constitutes a Y gate (column switch). The common source line CS0 which is associated with the data line D00 is connected to a circuit ground potential $V_{SS}$ (0 V) through a switching MOSFET Q12. The other data line D10 which is associated with the common source line CS0 is connected to a common data line CD1 through a MOSFET Q13 which constitutes a Y gate. The respective gates of the switching MOSFETs, Q11 to Q13 are supplied with a select signal Y0 which is formed by a Y decoder circuit YDCR to be described later.

The data line D10 is connected to the common data line CD1 through a MOSFET Q14 which constitutes a Y gate and to which another Y address (Y1) is allotted. The common source line CS1 which is disposed on the right-hand side (as viewed in FIG. 1) of the data line D10 is connected to the circuit ground potential $V_{SS}$ through a switching MOSFET Q15. The data line D01 which is disposed on the right-hand side of the common source line CS1 is connected to the common data line CD0 through a MOSFET Q16 which constitutes a Y gate. The respective gates of the MOSFETs Q14 to Q16 are supplied with a select signal Y1 which is formed by the Y decoder circuit YDCR. Thereafter, data lines, common data lines and corresponding switching MOSFETs are formed by repetition of a similar pattern.

The gates of storage MOSFETs which are disposed along the same column are respectively connected to the corresponding word lines W0 to Wn. The word lines W0 to Wn are respectively supplied with select signals which are formed by an X decoder circuit XDCR to be described later.

In this embodiment, depletion type N-channel MOSFETs Q1 to Q7 are provided between the data lines D00 to D01, the common source lines CS0 to CS2 and the like on the one hand and a power supply voltage (circuit operating voltage) $V_{CC}$ (5 V) on the other hand. In practice, a P-channel MOSFET Q33 is connected between the MOSFETs Q1 to Q7 and the power supply voltage $V_{CC}$ as will be described later. The depletion type MOSFETs Q1, Q3, Q5, Q7 and so on which are associated with the data lines D00 to D01 supply a bias voltage to the data lines and also act as load means therefor. The depletion type MOSFETs Q2, Q4, Q6 and so on which are associated with the common source lines CS0 to CS2 act so as to supply a bias voltage which brings the respective common source lines to a non-select level (high level).

For instance, when a select signal Y1 is formed by the Y decoder circuit YDCR, the switching MOSFETs Q14 to Q16 are turned ON, and the data lines D10, D01 and the common source line CS1 are thereby selected. In this case, the storage MOSFETs which are disposed between the data lines D10, D01 and the common source line CS1 alone must be brought to a selective state. However, if the potential of the common source lines CS0 and CS2 is at a low level such as the circuit ground potential, data items stored in storage MOSFETs which are disposed between the data line D10 and the common source line CS0 and those between the data line D01 and the common source line CS2 also appear on the data lines D10 and D01, undesirably. For this reason, the common source lines are also provided with the depletion type MOSFETs Q2, Q4, Q6 and so on as described above, whereby the selected common source line CS1 alone is supplied with the circuit ground potential by the operation of the switching MOSFET Q15, and the potentials of the non-selected common source lines CS0 and CS2 are made equal to the bias voltage applied to the data lines, thereby turning OFF the storage MOSFETs disposed between the data lines D10, D01 and the common source lines CS0, CS2 independently of the data stored therein.

The above-described load means may also be regarded as voltage limiting means or voltage clamping means for limiting the voltage applied to the data lines D00 to D01. The MOSFETs Q1, Q3, Q5, Q7 and so on practically function as resistor elements and therefore supply the data lines D00 to D01 with a voltage which is lower than the power supply voltage $V_{CC}$ by a voltage drop caused thereby. The load means may be constituted by P-channel MOSFETs, and the arrangement thereof may be defined by any of those of various known voltage limiting circuits. The load means are adapted to apply a voltage lower than the power supply voltage $V_{CC}$, that is, the high-level signal of a pair of binary signals, to the data lines D00 to D01. A voltage which is lower than about 3.5 V, e.g., about 2 V, is applied to the data lines D00 to D01 (described later).

The MOSFETs Q1 to Q7 are formed so as to be of the depletion type by implanting ions of an N-type impurity, e.g., arsenic, into the substrate and then effecting annealing. This ion implantation is carried out at 100 KeV and at a dose of $2.7 \times 10^{12}$ atoms/cm² after the formation of a gate insulator film and before the formation of gate electrodes.

Since the load means are defined by depletion type MOSFETs which are supplied at their gates with a reference voltage of the circuit, i.e., the circuit ground potential in the case of this embodiment, the following advantages result are obtained. Namely, since the above-described dose of arsenic is the only one process factor which determines the voltage drop effected by the load means, the voltage drop is not readily affected by variations in process. Further it is possible to obtain an appropriate voltage drop with a smaller area than that required in the case when the load means are defined by resistors. Since the bias voltage applied to the gate is defined as a reference potential, variations in bias voltage are small as compared with the case where the bias voltage is defined by the power supply voltage $V_{CC}$ or a voltage which is set at value between $V_{CC}$ and $V_{SS}$. Accordingly, variations in current flowing through the data lines are small. Since the load means can be regarded as stable constant-current sources, the current flowing through the data lines is not readily changed even when the power supply voltage $V_{CC}$ changes.

Similarly, the bias voltage of the non-select level which is applied to the common source lines is set to a voltage (about 2 V in this embodiment) lower than the power supply voltage $V_{CC}$ by the MOSFET's Q2, Q4, Q6 and so on which serve as load means or voltage limiting means. Thus, the potential of the common source lines is similarly stabilized.

In practice, a switching means, e.g., a P-channel MOSFET Q33, is connected between the load means and the power supply voltage $V_{CC}$ for the purpose of lowering the power consumption, the switching means being controlled by a predecode signal SB and an internal chip select signal CS. Similarly, a switching means, e.g., an N-channel MOSFET Q 34, which is controlled by the signals CS and SB is connected between the load means and the ground potential $V_{SS}$. The above-described two switching means are activated in a complementary fashion. More specifically, the MOSFETs Q33 and Q34 constitute in combination a CMOS inverter. This inverter is driven by a known two-input CMOS NAND gate circuit G1.

The signal CS is formed in a timing generator circuit TG on the basis of a chip select signal $\overline{CS}$. When the chip is selected in response to a shift of the signal $\overline{CS}$ to a low level, the signal CS is raised to a high level.

The signal SB is generated in a predecode circuit PD on the basis of some of the Y address signals (described later). Among a plurality of bits which constitute in combination the signal SB, a predetermined one bit is input to a predetermined gate circuit G1. As will be understood from FIG. 1, a combination of one CMOS inverter and one gate circuit G1 is provided for each group consisting of a plurality of data lines D and a plurality common source lines CS. More specifically, one memory array M-ARY is divided into memory blocks each including a plurality of data lines D, and the combination of the CMOS inverter and the gate circuit G1 is provided for each memory block. One of the plurality of bits constituting the signal SB is selectively raised to a high level, and the bias voltage is thereby selectively supplied to one memory block. This operation will be described later in detail with reference to FIG. 2.

When the chip is not selected, the signal CS is at the low level. In consequence, the potentials of all the data lines D and all the common source lines CS are made equal to the ground potential $V_{SS}$ by the operation of the MOSFET Q34. Thus, it is possible to lower the power consumption during the time when the chip is in a non-selected state, that is, the stand-by current can be reduced.

When the chip is selected, the signal CS is raised to the high level. Accordingly, the bias voltage is supplied through the MOSFET Q33 only to a memory block corresponding to the high-level bit in the signal SB. On the other hand, no bias voltage is supplied to the remaining memory blocks which correspond to the low-level bits in the signal SB. In other words, the potentials of the data lines D and common data lines CS in the other memory blocks are made equal to the ground potential $V_{SS}$ by the operation of the MOSFET Q34. In this way, it is possible to lower the power consumption during the time when the chip is in a selected state.

Addressing of the memory array M-ARY having the above-described arrangement is carried by each of the following circuit blocks.

An X address signal AX which is constituted by a plurality of bits supplied from external terminals is supplied to the X address buffer XADB, which forms complementary address signals defined by an in-phase internal address signal which is in phase with the address signal supplied from the external terminals and an out-of-phase internal address signal. These complementary address signals are decoded by an X decoder XDCR, and a signal for selecting one word line is formed by this X decoder XDCR. In this embodiment, the X address buffer XADB and the X decoder XDCR are jointly denoted by the reference symbol XADB·DCR.

In this embodiment, the word line select signal (high-level signal) is also set at a value lower than the power supply, voltage, e.g., 2.5 V, although not necessarily limited thereto. Thus, the current flowing through a memory cell (hence a sense amplifier) which is supplied with the limited drain voltage can be set at an appropriate value. For this purpose, the X address buffer XADB includes a word line voltage limiting means. This voltage limiting means may be defined by a known means.

A Y address signal AY which is constituted by a plurality of bits supplied from external terminals is supplied to the Y address buffer YADB, which forms complementary address signals defined by an in-phase internal address signal which is in phase with the address signal supplied from the external terminals and an out-of-phase internal address signal. These complementary address signals are decoded by a Y decoder YDCR, and a signal for selecting two data lines is formed by this Y decoder YDCR. In this embodiment, the Y address buffer YADB and the Y decoder YDCR are jointly denoted by the reference symbol YADB.DCR.

The x address buffer and decoder XADB.DCR and the y address buffer and decoder YADB.DCR are activated by timing signal (not shown) which are generated on the basis of the signal $\overline{CS}$ in the timing generator circuit TG. Each of the circuits XADB, YADB, XADR and YDCR has the same arrangement as that of a known CMOS circuit.

During a read operation, only one common source line which is associated with selected two data lines is brought to the ground potential, and the other common source lines are maintained at the bias potential. Accordingly, despite the fact that a multiplicity of storage MOSFETs are connected to each word line, a current flows only through those storage MOSFETs connected to the selected data lines, the size of the current depending upon the stored data. Thus, it is possible to lower the power consumption. In addition, the selecting operation of the common source lines which is carried out in accordance with the Y addresses enables those storage MOSFETs to be connected to one data line to which MOSFETs are allotted different Y addresses. Therefore, it is possible to arrange storage MOSFETs at a high density.

Figure 3:
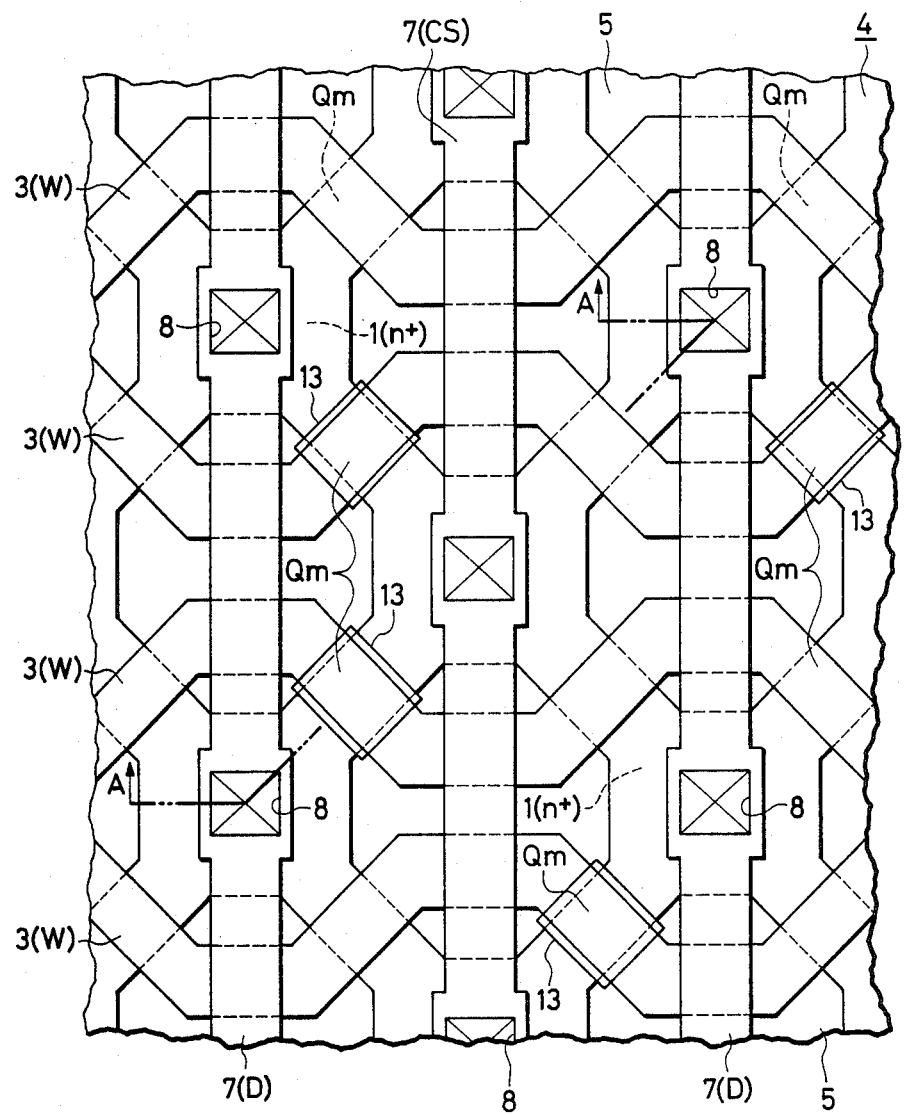
FIG. 3 is a plan view of memory cells in the mask-programmed ROM shown in FIG. 1.
Figure 4:
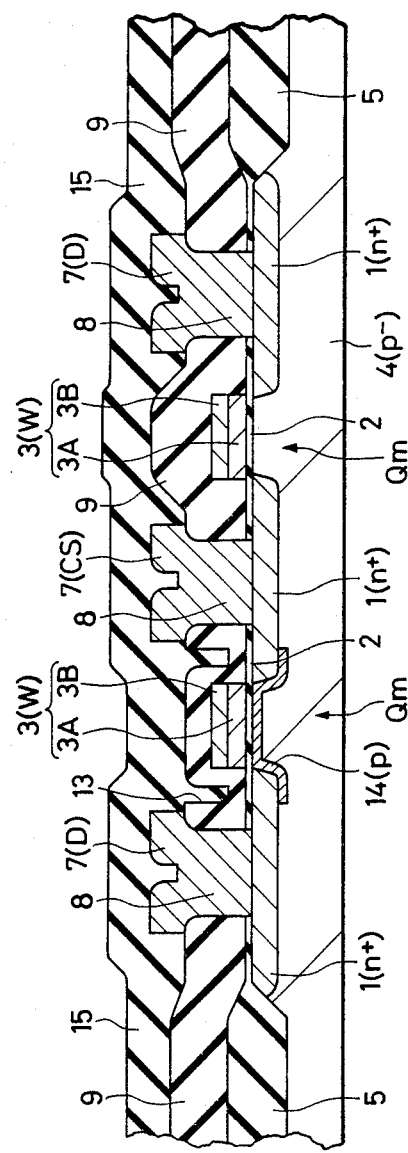
FIG. 4 is a sectional view of memory cells of the mask-programmed ROM shown in FIG. 1.

The structure of the mask-programmed ROM illustrated in FIG. 1 is shown in FIGS. 3 and 4. FIG. 4 is a sectional view taken along the line A—A in FIG. 3. Insulator films 2, 9 and 15 are not shown in FIG. 3 for the purpose of simplification of the drawing. The structure of this mask-programmed ROM, the method of producing the same and the method of writing data are described in more detail in U.S. patent application Ser. No. 855,592 filed on Apr. 24, 1986, which is cited as a reference in this specification. One memory cell in the mask-programmed ROM shown is FIG. 1 is defined by one MOSFET Qm which has a pair of n+ type semiconductor regions 1 which are employed as source and drain regions, a gate insulator film ($SiO_2$ film) and a gate electrode 3. The semiconductor regions 1 are provided in the surface layer of a semiconductor substrate 4 which is defined by a p− type silicon single crystal. MOSFETs Qm which are adjacent to each other are electrically isolated from each other by a field insulator film 5. The gate electrode 3 extends on the field insulator film 5 and defines a word line W. The gate electrode 3 (and the word line W) has a polycide structure which comprises a polycrystalline silicon layer 3A and a molybdenum silicide (or a silicide of a refractory metal such as tungsten, titanium or tantalum) layer 3B provided on the upper side of the layer 3A. A conductor layer 7 made of aluminum is employed as data lines D and a common source lines CS and is connected to the corresponding semiconductor region 1 through a contact hole 8 provided in an intermediate insulator film 9. The insulator film 9 is formed by, for example, successively stacking a silicon oxide film, a silicon nitride film and a phosphosilicate glass (PSG) film. A data line D and a common source line CS are connected respectively to the regions 1 which are commonly used as the drains and the sources of four memory cells. Aluminum layer 7 is not present above the gate electrodes 3 in order to be able carry out ion implantation through the gate electrodes 3. Openings 13 are formed by partially etching the intermediate insulator film in order to introduce ions of an impurity, e.g., boron, which is a p-type impurity, into MOSFETs Qm below the openings 13. The introduced impurity ions are activated by annealing to form p-type semiconductor regions 14. The threshold voltage of MOSFETs Qm having a p-type impurity introduced therein is higher than that of the other MOSFETs Qm. A protection film 15 which is defined by, for example, a silicon oxide film, is formed so as to cover the upper side of the semiconductor substrate 4.

The storage MOSFETs Qm are adapted to have different threshold voltages according to data stored therein. In a storage MOSFET to which the logic "1" is to be written, an impurity (boron) which has the same conductivity type as that of the semiconductor substrate 4 is introduced into a region (channel region) of the substrate 4 below the gate electrode by means of selective ion implantation carried out through the opening 13 (with a resist mask for forming the openings 13 left). Thus, this storage MOSFET Qm is allowed to have a relatively high threshold voltage, i.e., 2.0 V to 3.0 V. Such data writing process by ion implantation technique is carried out by implantation of boron ions (B++) which is executed near the final step in the production of semiconductor integrated circuits formed on a semiconductor wafer, e.g., after the formation of data lines D or common source lines CS which are defined by an aluminum layer. The ion implantation is effected through the gate electrodes 3 of MOSFETs Qm which define memory cells at a dose of 0.8 to $1.0 \times 10^{13}$ atoms/cm$^2$ and with a relatively high energy on the order of 150 KeV. The ion implantation must be effected with a relatively high energy in order to avoid contamination which may be caused by ion implantation and due to the fact that the insulator film 9 is left because of gettering of an impurity and the gate electrode 3 having a polycide structure has a relatively large thickness. Therefore, defects are readily generated in the substrate. In addition, since annealing is allowed to be carried out only at a relatively low temperature (about 450° C. or lower), it is impossible to satisfactorily activate the impurity and repair defects generated by the ion implantation. This leads to an increase of leakage current in memory cells and also to a lowering of breakdown voltage at the drain junctions. Further, the amount of impurities which reach the channel regions is relatively small, and there are variations in said amount. Therefore, the threshold voltage of each of the storage MOSFETs Qm subjected to the above-described writing is set at a relatively low value, i.e., 2 to 3 V, and there are relatively large variations in the threshold voltage due to variations in film thickness of the gate electrodes 3 and the remaining intermediate insulator films 9 thereon. On the other hand, the threshold voltage of storage, MOSFETs which are not subjected to the above-described writing (i.e., these MOSFETs have the logic "0") is set at a relatively low value, e.g., 0.5 to 1 V.

Figure 5:
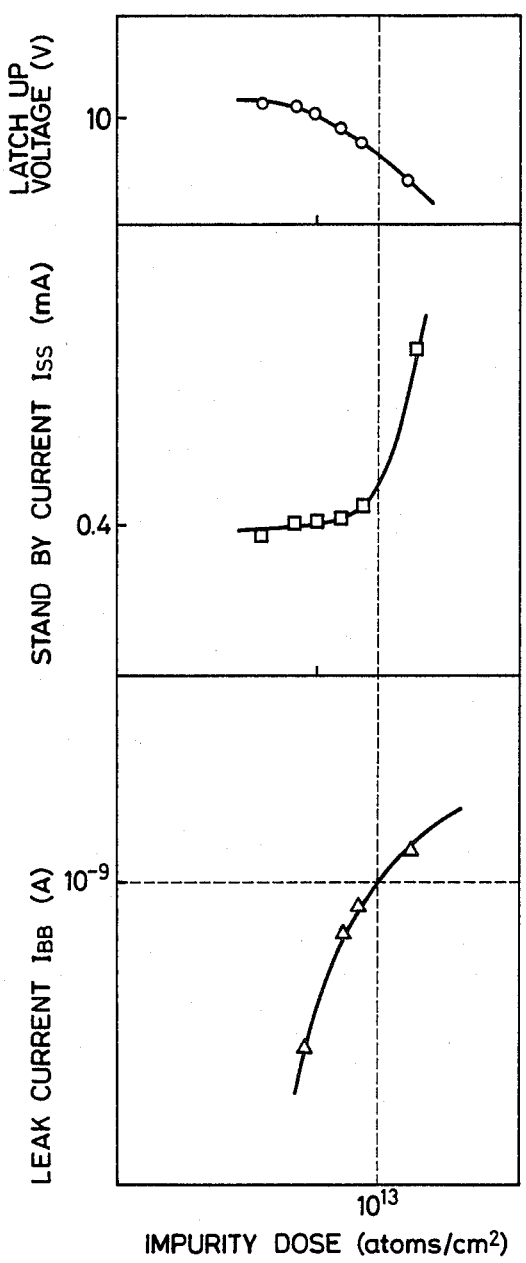
FIG. 5 shows the relationship between the impurity dose on the one hand and the leakage current, stand-by current and latch-up voltage on the other.

The dose of an impurity (boron) which is introduced into the MOSFETs Qm is set in accordance with FIG. 5, that is, the relationship between the impurity dose on the one hand and the leakage current, stand-by current and latch-up current on the other. The axis of abscissas represents the dose of an impurity (boron) introduced by ion implantation. FIG. 5 shows the results of an experiment carried out under the condition that the voltage (gate voltage) $V_G$ applied to the gate electrode 3 of MOSFET Qm is 0, the voltage (drain voltage) $V_D$ applied to the drain region 1 is 5 V, and the voltage (substrate voltage) $V_{BB}$ applied to the substrate 4 is −3 V. The axis of ordinates represents current flowing through a portion of the substrate for each memory cell, that is, leakage current $I_{BB}$. The axis of ordinates also represents stand-by current (stand-by current flowing through the mask-programmed ROM) $I_{BB}$ and latch-up voltage.

As will be clear from FIG. 5, when the dose of an impurity (boron) exceeds $1.0 \times 10^{13}$ atoms/cm$^2$, the stand-by current $I_{SS}$ increases remarkably. This is because the proportion of leakage current $I_{BB}$ attributable to damages caused by impurity ion implantation in the stand-by current is increased (becomes dominant). When circuits (such as the decoders XDCR and YDCR and the sense amplifiers SA) other than the memory arrays are defined by complementary MOS circuits (hereinafter referred to as "CMOS circuits"), the latch-up voltage in the CMOS circuits is considerably lowered, that is, there is a fear of latch-up occurring easily. This is because the current flowing through the substrate 4, i.e., the leakage current $I_{BB}$, which is regarded as a current which triggers latch-up increases. Accordingly, the dose of an impurity (boron) is set so as to be less than $1.0 \times 10^{13}$ atoms/cm$^2$. Taking into consideration margins in manufacture, it is necessary, in order to prevent the actual impurity dose from exceeding the above-described value, to set the impurity dose at $0.8 \times 10^{13}$ atoms/cm$^2$. In other words, it is possible to prevent any increase in stand-by current and lowering of latch-up voltage by reducing leakage current per memory cell to 1 nA or less.

Figure 6:
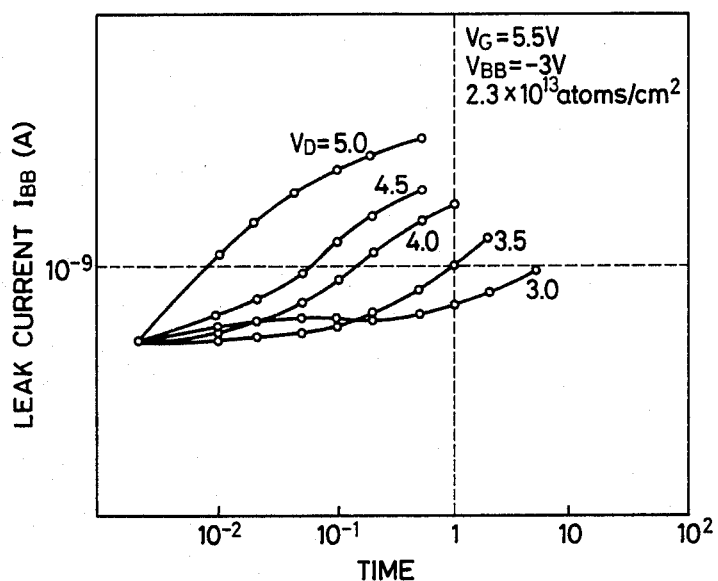
FIG. 6 shows the relationship between the leakage current flowing when a predetermined voltage is applied and time.

The voltage which is applied to the drain region (or source region) of each MOSFET Qm is set in accordance with FIG. 6, that is, the chart showing the relationship between the leakage current $I_{BB}$ flowing when a predetermined drain voltage $V_D$ is applied and time. The axis of abscissas of FIG. 6 represents time in units where a period of time in an accelerated lifetime test which corresponds to 10 years in actual use in normalized as 1. The axis of ordinates represents leakage current $I_{BB}$ at one MOSFET Qm which has boron ions implanted therein for forming the region 14. For the accelerated test, the gate voltage $V_G$ of the MOSFET Qm is set at a considerably high value, i.e., 5.5 V, whereas the gate voltage $V_G$ in an actual operation is about 2.5 V. In addition, the dose of boron is set at $2.3 \times 10^{13}$ atoms/cm$^2$, which is considerably larger than the above-described value.

As will be understood from FIG. 6, in order to reduce the leakage current $I_{BB}$ to 1 nA or less and ensure a predetermined lifetime (corresponding to 10 years in actual use), it is necessary to set the drain voltage VD at 3.5 V or lower. By so doing, it is possible to reduce leakage current $I_{BB}$ due to crystal defects caused by introduction of an impurity (boron), particularly, crystal defects at the pn junction between the drain region (and source region) 1 and the semiconductor substrate. Thus, since the leakage current $I_{BB}$ is reduced, the stand-by current can be reduced, and the latchup voltage can be raised.

For the same reason as the above, the bias voltage which is applied to the common source lines CS which is not selected is set at 3.5 V or lower.

Figure 7:
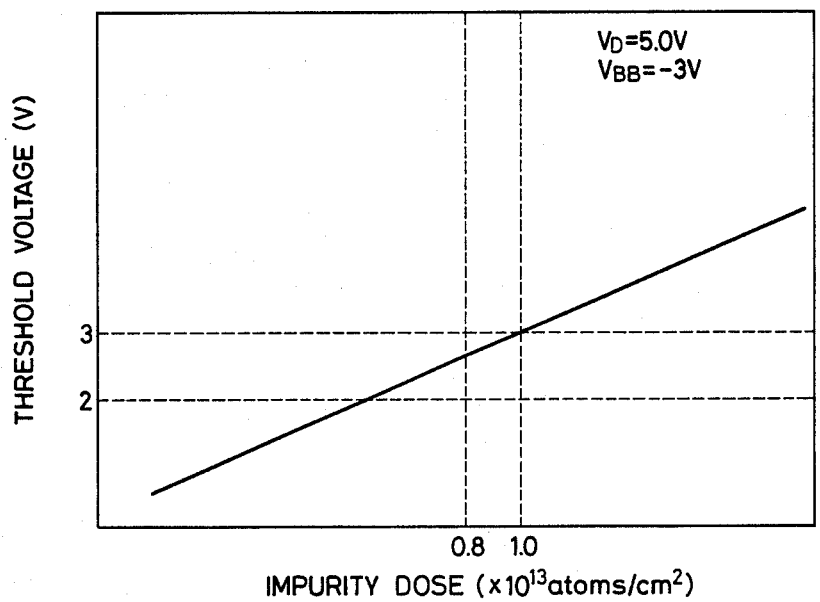
FIG. 7 shows the relationship between the impurity dose and the threshold voltage.

The threshold voltage of the MOSFETs Qm having the impurity (boron) introduced therein is set in accordance with FIG. 7, that is, the chart showing the relationship between the impurity dose and the threshold voltage. The axis of abscissas represents the dose of the impurity (boron), and the axis of ordinates represents the threshold voltage of the MOSFETs Qm.

As will be understood from FIG. 5, it is necessary, in order to reduce the leakage current $I_{BB}$ to 1 nA or less, to set the impurity dose at about $1.0 \times 10^{13}$ atoms/cm$^2$ or less, and therefore the threshold voltage is set at about 3.0 V or lower as shown in FIG. 7. Since it is necessary to make a judgement as to whether data is "0" or "1", the threshold voltage is preferably set at 2.0 V or higher. More specifically, the threshold voltage of the MOSFETs Qm having no impurity introduced therein is set at 0.5 to 1.0 V, and the threshold voltage of the MOSFETs Qm having an impurity introduced therein is set at 2.0 to 3.0 V. Thus, it is possible to set a threshold voltage which enables judgement of data and reduce the leakage current $I_{BB}$. Therefore, it is possible to prevent deterioration of MOSFETs Qm due to hot-carrier injection. Further, since the leakage current is reduced, the stand-by current can be reduced, and the latch-up voltage can be raised. It should be noted that, if margins in manufacture are taken into consideration, the threshold voltage is preferably set at about 2.2 to 2.8 V. Data shown in FIG. 7 was obtained by measurement in which the drain voltage $V_D$ was set at 5 V.

In the production of mask-programmed ROM in which data is written by introduction of an impurity after the formation of an aluminum wiring layer for forming data lines D and source lines CS, crystal defects cannot be repaired by annealing at high temperature on the order of 900° to 1000° C. For this reason, it is particularly effective practice, in order to reduce the leakage current $I_{BB}$ to set the drain (and source) voltage at 3.5 V or lower, or set the threshold voltage at 2.0 to 3.0 V (i.e., set the impurity dose at $1 \times 10^{13}$ atoms/cm$^2$ or lower).

In this embodiment, dummy cells such as those described below are provided for the purpose of accurately making discrimination between signals read out from storage MOSFETs Qm having a small threshold voltage difference such as that described above.

Although not necessarily limitative, for example, two dummy MOSFETs Qd and Qd' which are in parallel relation to each other are provided for each of the word lines W0 to Wn in a dummy cell array D-ARY in such a manner that the gates of the dummy, MOSFETs Qd and Qd' are connected to corresponding word lines W. These MOSFETs Qd and Qd' are disposed between a dummy data line DD and a pair of dummy common source lines DCS which are disposed on both sides of the dummy data line DD, thus arranging the MOSFETs Qd and Qd' in a parallel form. One dummy MOSFET Qd is formed in the same way as the storage MOSFETs Qm having the abovedescribed low threshold voltage (having no boron introduced therein). The other dummy MOSFET Qd' is formed in the same way as the storage MOSFETs Qm with the above-described high threshold voltage (having boron introduced therein). The dummy MOSFET Qd' having the high threshold voltage is provided for the purpose of compensating for a drop in the high-level voltage due to leakage current which occurs in storage MOSFETs that should be OFF with respect to the word line select level (about 2 V).

The potential of the dummy data line DD which is given by the dummy MOSFETs Qd and Qd' is supplied through a switching MOSFET Q20 to sense amplifiers SA0 and SA1 (described later) for forming a reference voltage Vref. The dummy common source lines DCS are connected to the circuit ground potential $V_{SS}$ through switching MOSFETs Q19 and Q21. Although not necessarily limited thereto, the gates of the switching MOSFETs Q19 to Q21 are supplied with a select signal YD formed by the Y decoder circuit YDCR. In this embodiment, the signal YD is raised to a high level in synchronism with one of the signals Y0, Y1, Y2. . . . output from the Y decoder YDCR when the chip is selected.

MOSFETs Q8 to Q10 are provided between the dummy data line DD and the dummy common source lines DCS on the one hand and the power supply voltage $V_{CC}$ on the other. The MOSFETs Q8 to Q10 are formed under the same conditions as those for the MOSFETs Q1 to Q7. The MOSFETs Q8 to Q10 are provided for the purpose of limiting the bias voltage applied to the dummy data line DD and the dummy common data lines DCS for the reason described above, and for making said bias voltage equal to the bias voltage applied to the data lines D and the common source lines CS.

Further, a CMOS inverter is provided for the purpose of lowering the power consumption, the CMOS inverter being constituted by a P-channel MOSFET Q35 and an N-channel MOSFETs Q36 which respectively correspond to the MOSFETs Q33 and Q34. The output of this CMOS inverter is connected in common to the MOSFETs Q8 to Q10. The signal CS is supplied to the CMOS inverter through a CMOS inverter IV1. Thus, when the chip is in a selected state, the signal CS is at a high level, and therefore the bias voltage is supplied through the MOSFET Q35 to the MOSFETs Q8 to Q10. On the other hand, when the chip is not selected, the signal CS is at a low level, and therefore no bias voltage is supplied. Accordingly, the stand-by current can be reduced.

The sense amplifier SA0 in this embodiment comprises a preamplifier PA0 for current-to-voltage conversion and a differential amplifier circuit A0. The preamplifier PA0 is of the current sense type. Thus, it is possible to precisely sense a very small current flowing through the data lines D under the condition that the potential of the data lines D is low, i.e., 2 V; the word line select level is low, i.e., 2.5 V; and the difference in terms of threshold voltage between the MOSFETs Qm is small, i.e., 0.5 to 1.0 V or 2.0 to 3.0 V. The preamplifier PA0 is composed of the following circuit elements. The common data line CD0 is connected to the drain of a P-channel MOSFET Q23 in the form of a diode through a depletion type MOSFET Q22 which is connected at the gate to the circuit ground potential $V_{SS}$. Thus, a selected data line D is supplied with a read current through the MOSFET Q23, the common data line CD0 and a switching MOSFET which constitutes a Y gate. In this case, a bias voltage in accordance with the threshold voltage of the depletion type MOSFET Q1 or the like is applied to the selected data line. Also to the common data line CD0 (CD1) is applied a bias voltage (about 2.0 V) in accordance with the threshold voltage of the depletion type MOSFET Q22. Since the MOSFETs Q33 and Q23 are of the P-channel type, they have no effect on the bias voltages. The depletion type MOSFETs Q1 to Q7 and so on provided for the data lines D and common source lines CD in the memory array M-ARY and the depletion type MOSFET Q22 which constitutes the preamplifier PA0 are formed under the same manufacturing conditions, whereby the potential of the data line D and that of the common data line CD (the potential at the input terminal of the sense amplifier) can be set so as to be equal to each other. Thus, in a read operation of storage MOSFET Qm, the current flowing through the MOSFETs Q23 and Q22, which constitute in combination the preamplifier PA0, is immediately allowed to be equal to a current flowing through a storage MOSFET Qm selected in accordance with the select operations of one word line W and one data line. D, thus enabling realization of a high-speed read operation.

More specifically, although each data line has a relatively large parasitic capacitance due to the fact that a large number of storage MOSFETs Qm are connected thereto, the current detected by the sense amplifier SA0 can be made equal to a Qm by making the above-described two bias voltages equal to each other. It is therefore possible to ignore practically the above-described parasitic capacitance.

In this mask-programmed ROM, a relatively low bias voltage, i.e., about 2 V, is applied to the data lines D for the purpose of, for example, achieving a high-speed read operation. More specifically, it is intended to realize a high-speed operation of the ROM by making the potential of the data lines D coincident with the intermediate potential at which the sensitivity of the sense amplifier is highest. However, in the case where the load means for the data lines D are defined by elements other than depletion type MOSFETs which are supplied at their gates with the ground potential $V_{SS}$, it is considerably difficult to set the bias voltage applied to the data lines D to a desired stable potential. When there is a voltage difference between the bias voltage applied to the sense amplifier and the potential of a selected data line, a charge-up or discharge current flows for canceling the potential difference, and the read current which flows through the selected storage element is masked while the charge-up or discharge current is flowing. As a result, the read operation is delayed by an amount corresponding to a period to time consumed for the charge-up or discharging operation. In this embodiment, the potential of the data lines D can be set to a predetermined stable potential.

The MOSFET Q22 which serves as a load means (voltage limiting means) for biasing the common data line CD is defined by a depletion type MOSFET which is supplied at its gate with the ground potential. Accordingly, the bias voltage applied to the common data line CD can be set to a predetermined stable potential for the same reason as that described above.

Further, the potential of the data lines D and the common data lines CD can be made equal to each other by forming the MOSFET Q22 and the MOSFETs Q1 to Q27 in accordance with the same manufacturing process. This is effective when a current sense type sense amplifier (preamplifier) is employed.

The MOSFET Q23 is provided with a P-channel MOSFET Q24 formed in a current mirror fashion. Although not necessarily limitative, an N-channel MOSFET Q25 in the form of a diode is connected as a load to the drain of the MOSFET Q24. A power switch MOSFET Q26 which is supplied at the gate with the internal chip select signal CS is provided between the source of the MOSFET Q25 and the circuit ground potential. Thus, a current is supplied to the MOSFETs Q24 and Q25 only when the ROM is set in the read mode. A voltage signal in accordance with the above-described read current is obtained from the drain of the MOSFET Q25, and supplied to the non-inverting input terminal (+) of the differential amplifier circuit A0 which is defined by a known CMOS circuit.

The inverting input terminal (−) of the differential amplifier circuit A0 is supplied with a reference signal Vref which is obtained from the dummy data line DD through a preamplifier similar to the above which is constituted by MOSFETs Q27 to Q31.

The MOSFET Q27 is defined by a depletion type MOSFET which is supplied at its gate with the ground potential $V_{SS}$ for the same reason as that described above. Further, the MOSFET Q27 is formed in accordance with the same manufacturing process as that for the MOSFETs Q8 to Q10.

It should be noted that, in the preamplifier of the sense amplifier SA0 on the side thereof which is closer to the reference potential source, the conductance of the MOSFET Q28 is made twice as large as that of the MOSFET Q23, or the conductance of the MOSFET Q29 (Q32) is set so as to be ½ of that of the MOSFET Q23. Thus, the conductance of the dummy MOSFETs Qd is allowed to be practically equivalent to a half of the conductance of the storage MOSFET Qm, thus forming the reference voltage Vref.

The other common data line CD1 is similarly provided with a sense amplifier SA1 comprising a preamplifier PA1 and a differential amplifier A1 which are similar to those described above. It should be noted that a reference voltage Vref for this sense amplifier SA1 is obtained from a MOSFET Q32 disposed in current mirror relation to the MOSFET Q28.

The signals output from the sense amplifiers SA0 and SA1 are output to external terminals through an output buffer circuit DOB (not shown). The output buffer circuit DOB is activated in response to a timing signal (not shown) which is formed in the timing generator circuit on the basis of the signal $\overline{CS}$.

As the result of one operation of selecting word and data lines W and D, an output signal comprising two bits is obtained from one memory array M-ARY.

As described above, in the case where the operating point of the sense amplifier, that is, the potential of the common data lines CD, and the potential of the data lines D are made equal to each other using depletion type MOSFETs, extremely stable operating conditions can be produced since process variations in threshold voltage among depletion type MOSFETs are very small, i.e., about ±0.2 V.

Figure 2:
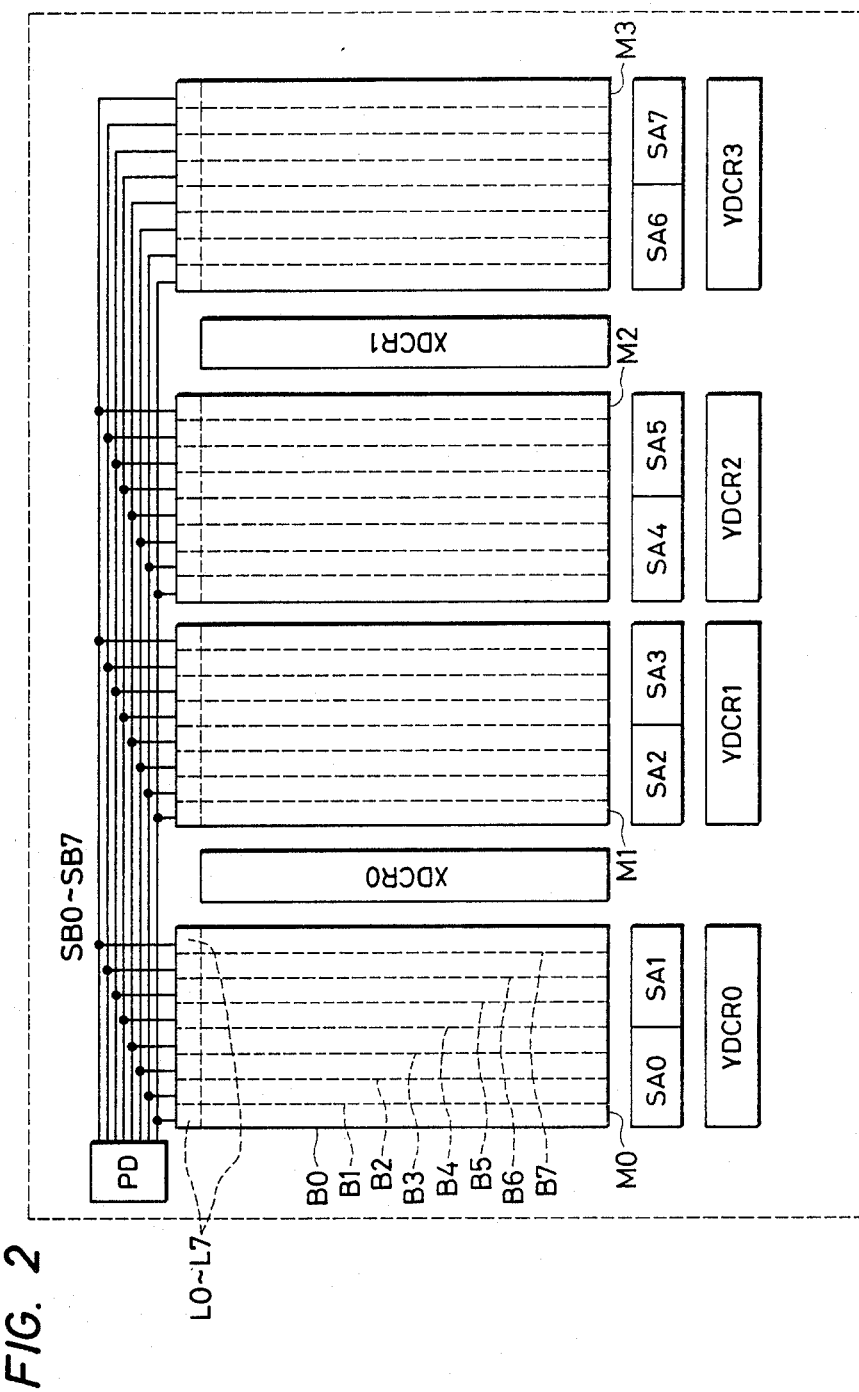
FIG. 2 is a block diagram of an essential part of the mask-programmed ROM shown in FIG. 1.

FIG. 2 is a block diagram schematically showing the mask-programmed ROM according to the present invention. In this figure, memory arrays and memory array select circuits constituted by decoders and sense amplifiers are shown, but address buffers, data output circuit, timing generator circuit and signal lines between these circuit blocks are omitted. The ROM includes four memory arrays M0 to M3, although not necessarily limitative thereto. Each of the memory arrays M0 to M3 corresponds to the memory array M-ARY shown in FIG. 1. Each of the memory arrays M0 to M3 includes, for example, 8 memory blocks B0 to B7 as indicated by the chain lines. An X decoder circuit XDCR0 is disposed between the memory arrays M0 and M1, and an X decoder circuit XDCR1 between the memory arrays M2 and M3. Each of the X decoder circuits XDCR0 and XDCR1 corresponds to the X decoder circuit XDCR shown in FIG. 1.

In FIG. 2, each of the memory arrays M0 to M3 includes a Y gate circuit (column select circuit) such as that described above. In the memory arrays M0 to M3, signals read out from data lines selected by the Y gate circuits are respectively supplied to pairs of sense amplifiers SA0, SA1 to SA6, SA7 such as those described above. It should be noted that each of the sense amplifiers SA3, SA4 and SA7 corresponds to the above-described sense amplifier SA0, and each of the sense amplifiers SA2, SA5 and SA6 corresponds to the above-described sense amplifier SA1. The Y gate circuits of the memory arrays M0 to M3 are respectively supplied with select signal formed by Y decoder circuits YDCR0 to YDCR3. Each of the Y decoder circuits YDCR0 to YDCR3 corresponds to the Y decoder circuit YDCR shown in FIG. 1.

Although not necessarily limitative, the X decoder circuit XDCR0 selects one word line from each of the memory arrays M0 and M1, and the X decoder circuit XDCR1 selects one word line from each of the memory arrays M2 and M3. Further, each of the Y decoder circuits YDCR0 to YDCR3 forms signals for selecting a pair of data lines which respectively correspond to one of the pairs of sense amplifiers SA0, SA1 to SA6, SA7 for the memory arrays M0 to M3. Accordingly, two read signal bits are obtained from each of the memory arrays M0 to M3. Thus, a signal including a total of 8 bits is obtained in each read operation.

In this embodiment, in order to lower the power consumption when the ROM is in a non-select state and in a read state, each of the memory arrays M0 to M3 is provided with load circuits L0 to L7 which respectively correspond to the memory blocks B0 to B7 as indicated by the chain lines in FIG. 2. Each of the load circuits L0 to L7 is composed of a plurality of depletion type MOSFETs respectively corresponding to the data lines D, one CMOS inverter comprising MOSFETs Q33 and Q34, and one NAND gate circuit G1. One input terminal of the gate circuit G1 of each of the load circuits L0 to L7 is supplied with one of the select signals (predecode signals) SB0 to SB7 which are formed by a predecode circuit PD. Since in this embodiment each of the memory arrays M0 to M3 is divided into 8 blocks, the predecode circuit PD is supplied with complementary address signals formed on the basis of higher-order 3 bits in a Y address signal AY. Accordingly, each of the blocks is defined by data lines which correspond to Y address signals whose higher-order 3 bits are the same as each other. The predecoder circuit PD has the same arrangement as that of a known decoder circuit defined by a CMOS circuit, such as the X decoder circuits XDCR, and selectively raises one of the signals SB0 to SB7 to a high level on the basis of the 3-bit Y address signal. As a result, the power supply voltage is selectively supplied by the load circuits L0 to L7. More specifically, a high-level voltage such as the power supply voltage $V_{CC}$ is supplied to the drain of the depletion MOSFET which constitutes the load circuit corresponding to one of the eight divided memory blocks B0 to B7 in each of the memory arrays M0 to M3 to which memory block a pair of data lines D to be selected belong.

In a read operation of storage MOSFET's Qm, when a pair of data lines D provided in, for example, the memory block B0 are subjected to reading, no bias voltage is supplied to the other memory blocks B1 to B7 from the corresponding load MOSFETs, and when the ROM is in a non-select state, no bias voltage is supplied from any of the load MOSFET's. Therefore, it is possible to prevent any increase in power consumption due to leakage current.

Since each of the memory arrays M0 to M3 is divided into memory blocks B0 to B7 and data is read out from one memory block in each of the memory arrays M0 to M3, it is possible to reduce the number of required sense amplifiers. More specifically, if a total of 8 read signal bits were obtained from each of the memory arrays M0 to M3, it would be necessary to provide 8 sense amplifiers for each memory array.

A dummy cell block which comprises a plurality of dummy cells, one dummy data line DD and two dummy common source lines DCS is provided for each of the memory arrays M0 to M3. Accordingly, a load circuit for a dummy block, which comprises an inverter IV1 and MOSFETs Q8 to Q10, Q35, Q36, as shown in FIG. 1, is also provided for each memory array. Since in a read operation two memory cells for two bits are always selected from each memory array, each dummy block is supplied with the bias voltage at all times during the period of time when the chip is in a selected state.

It should be noted that, in the case where memory cells are selected from only one memory array in a read operation, the bias voltage may be supplied by the predecode circuit only to the dummy cell block corresponding to the selected memory array.

The arrangement shown in FIG. 2 may be such that memory arrays, X decoder circuits, sense amplifiers and the like are additionally provided in symmetry with the illustrated ones with respect to the Y decoder circuits YDCR0 to YDCR3 so as to read out 16 bits at maximum in one read operation.

As has been described above, the novel technique disclosed in this application provides the following various advantages.

(1) A voltage which is lower than a power supply voltage is applied (as a bias voltage) to a drain and/or a source region (a data line and/or a common source line) of each MOSFET which defines a memory cell, and this enables a reduction in leakage current and an extension in lifetime of the MOSFET. (2) The dose of an impurity is set at $1 \times 10^{13}$ atoms/cm$^2$ or less, or the threshold voltage of the MOSFET is set at 2.0 to 3.0 V, so that leakage current can be reduced and the lifetime of the MOSFET can be extended.

(3) Since stand-by voltage can be lowered by virtue of the advantage (1) or (2), power consumption can be lowered. In addition, since latch-up voltage can be raised, it is possible to prevent occurrence of latch-up.

(4) The advantages (1) to (3) are similarly obtained with respect to dummy cells.

(5) A depletion type load MOSFET which is supplied at its gate with a ground potential is provided between each data line in a memory array and a power supply voltage. Since the threshold voltage of depletion type MOSFETs can be controlled precisely and process variations in threshold voltage of depletion type MOSFET's are small, the bias voltage applied to the data lines can be stably set at a predetermined value. Similar advantages can be obtained with respect to common source lines, dummy data lines and dummy common source lines.

(6) A depletion type load MOSFET which is supplied at its gate with a ground potential is provided between each data line in a memory array and a power supply voltage, and data is read out by an amplifying MOSFET which supplies a current to a selected data line through a depletion MOSFET which is supplied at its gate with the ground potential. Since the threshold voltage of depletion type MOSFETs can be controlled precisely and process variations in threshold voltage of depletion type MOSFET's are small, the bias voltage applied to a data line and the bias voltage applied to a sense amplifier which receives a signal read out therefrom can be made equal to each other. Accordingly, as soon as a storage MOSFET is selected, a true read current can be obtained, and it is therefore possible to increase the read operation with a simple arrangement.

(7) Common source lines for storage MOSFETs which are arranged so as to extend parallel with data lines are selectively grounded in accordance with a Y (column) select signal, so that no current flows through non-selected storage MOSFET's. Thus, it is possible to lower the power consumption during a read operation.

(8) Since the advantage (7) enables the common source lines to have a select function, storage MOSFET's to which different Y addresses are allotted can be connected in common to one data line. Accordingly, it is possible to reduce the number of required data lines, and therefore storage MOSFET's can be formed at a high density.

(9) In a read operation, an operating voltage is supplied only to one of the depletion type load MOSFETs which is provided for a memory block to which a selected date line belongs, the load MOSFET's being respectively provided for memory blocks. Accordingly, during a read operation, the other memory blocks are not supplied with the bias voltage through the corresponding load MOSFETs, and when the chip is in a non-selected state, all the memory blocks are prevented from being supplied with the bias voltage. It is therefore possible to prevent any increase in power consumption due to leakage current flowing at the drain of a storage MOSFET.

(10) The bias voltage applied to the data lines and the common source lines is limited to a level which is lower than a power supply voltage. This enables a bias voltage opposite in polarity to said bias voltage to be applied to the substrate.

Although the present invention has practically been described by way of one embodiment, the present invention is not necessarily limitative to the described embodiment, and it is a matter of course that various changes and modifications may be imparted thereto without departing from the scope and spirit of the invention.

For example, when one bit is read out in one read operation, either the sense amplifier SA0 or SA1 may be selectively activated in accordance with the Y address signal and the read signal thus obtained may be output from a common data output buffer. In addition, $2^n$ bits, e.g., 2 bits or 4 bits, may be read out in each read operation. The bias voltage may be applied only to dummy cells corresponding to a memory array which includes a selected memory cell.

The arrangement of a memory array (memory block) may be such that the source of each storage MOSFET is connected directly to a ground potential of the circuit. In such case, the drain of the storage MOSFET is connected to one of the data lines which are independent of each other.

Each of the semiconductor regions may be opposite in conductivity type to the described one. An impurity which is implanted into the substrate through the gate electrode may be of N type, such as phosphorus or arsenic, and the threshold voltage may be lowered by the implanted impurity. Memory cells and/or elements constituting peripheral circuits may be defined by MIS (Metal Insulator Semiconductor) FET's.

Memory cells and/or MISFETs which constitute peripheral circuits and have the same conductivity type as that of the memory cells may be formed within a well region which is formed within a substrate and which is equal or opposite in conductivity type to the substrate.

The present invention may also be applied to a series mask-programmed ROM in which a plurality of MOSFETs which define memory cells are connected in series between a power supply voltage and a reference voltage.

Any type of method may be employed to write data into storage MOSFETs. For example, FAMOSFETs (Floating gate Avalanche injection MOSFETs) or the like may be employed as storage MOSFETs, and writing may be electrically effected.

The present invention may widely be applied to semiconductor memory devices which include memory elements having two different threshold voltages in accordance with data stored therein, such as mask-programmed ROMs, EPROMs (Erasable Programmable Read-Only Memory) or other types of ROM.

What is claimed is:

1. A read-only memory comprising:
    a memory array including a plurality of word lines, a plurality of data lines intersecting said word lines, an a plurality of memory cells respectively provided at the intersections between said word lines and said data lines, each of said memory cells including a MOSFET, wherein some of said memory cells include a MOSFET with a threshold voltage which is made different from that of the other memory cells by ion implantation of an impurity carried out through their gate electrodes; and
    depletion type MOSFETs connected between said data lines and a power supply potential and having a ground potential applied to their gate electrodes.

2. A read-only memory according to claim 1, wherein said depletion type MOSFETs are of N-channel type.

3. A read-only memory according to claim 2, wherein said depletion type MOSFETs cause a potential applied to said data lines to be lowered to about 3.5 V or less.

4. A read-only memory according to claim 2, further comprising:
    a P-type semiconductor substrate to which a negative potential is applied;
    wherein said memory cells are N-channel type MOSFETs, respectively.

5. A read-only memory according to claim 1, wherein the dose of said impurity for ion implantation is about $1.0 \times 10^{13}$ or less.

6. A read-only memory comprising:
    a memory array including a plurality of word lines, a plurality of data lines intersecting said word lines, and a plurality of memory cells respectively provided at the intersections between said word lines and said data lines;
    a plurality of depletion type MOSFETs coupled between said data lines and a power supply potential and having their respective gate electrodes applied with a ground potential; and
    first switching means connected between said power supply potential and said depletion type MOSFETs, for applying during a period of time when said read-only memory is selected, a predetermined potential which is lower than said power supply potential is applied to at least a selected data line.

7. A read-only memory according to claim 6, further comprising:
    second switching means connected between said ground potential and said depletion type MOSFETs and adapted to operate in complementary relation to said first switching means, such that, during a period of time when said read-only memory is not selected, said ground potential is applied to said data lines.

8. A read-only memory according to claim 7, wherein said first and second switching means are respectively defined by a P-channel MOSFET and an N-channel MOSFET which are supplied at their gate electrodes with a common switch control signal.

9. A read-only memory according to claim 7, wherein said first and second switching means comprise:
    a CMOS logic inverter arrangement responsive to a gate signal connected between said power supply potential and ground potential and having a common drain connection coupled to one of the source or drain electrodes of said depletion type MOSFETs.

10. A read-only memory according to claim 9, wherein said CMOS logic inverter gate signal is provided by a selecting circuit responsive to a chip select signal and a predecoding signal.

11. A read-only memory comprising:
    a memory array including a plurality of word lines, a plurality of data lines intersecting said word lines, and a plurality of memory cells respectively provided at the intersections between said word lines and said data lines;
    a plurality of depletion type MOSFETs coupled between said data lines and a power supply potential and having their gate electrodes applied with a ground potential
    at least one first switching means wherein each is provided so as to correspond with a predetermined plurality of said depletion type MOSFETs, each of said first switching means being connected between said power supply potential and said plurality of depletion type MOSFETs; and
    at least one second switching means corresponding in number to said first switching means and each second switching means being operationally associated with a first switching means so as to effect in their complementary operation, said second switching means being connected between said ground potential and said depletion type MOSFETs.

12. A read-only memory according to claim 11, further comprising:
    first selecting means for selecting said word lines in accordance with first address signals;
    second selecting means for selecting said data lines in accordance with second address signals; and
    third selecting means for providing a control signal for controlling said first and second switching means, said control signal being provided in response to a chip select signal and a part of said second address signals, such that, during a period of time when said read-only memory is selected, a predetermined potential which is lower than said power supply potential is applied to said data lines through a corresponding one of said first switching means selected on the basis of a part of said second address signals, and wherein said ground potential is applied to other ones of said data lines corresponding to other ones of said first switching means.

13. A read-only memory according to claim 12, wherein said first and second switching means comprise:
    a CMOS logic inverter arrangement means comprise:
    signal connected between said power supply potential and ground potential and having a common drain connection coupled to one of the source or drain electrodes of said depletion type MOSFETs.

14. A read-only memory comprising:

a memory array including a plurality of word lines, a plurality of data lines intersecting said word lines, and a plurality of memory cells respectively provided at the intersections between said word lines and said data lines;

depletion type MOSFETs coupled between said data lines and a power supply potential and having their gate electrodes applied with a ground potential a sense amplifier for sending data read out from said memory cells to said data lines during a reading operation of said read-only memory, said sense amplifier including an amplifying MOSFET connected to an input node of said sense amplifier to supply a current to said data lines for said reading operation; and a depletion type MOSFET connected between said data lines and the input node of said sense amplifier and having its gate electrode biased by said ground potential.

15. A read-only memory according to claim 14, wherein said sense amplifier further includes a current mirror having an input and an output and a differential amplifier, wherein said amplifying MOSFET defines an input-side MOSFET of said current mirror, the output of said current mirror being supplied to said differential amplifier circuit.

16. A read-only memory comprising:
a memory array including a plurality of word lines, a plurality of data lines intersecting said word lines, a plurality of memory cells respectively provided at the intersections between said word lines and said data lines, each of said memory cells including an N-channel MOSFET and common source lines each one for connecting in common at least the sources of those MOSFETs connected to the same data line;

first depletion type MOSFETs, each being coupled between a respective one of said data lines and a power supplied potential and having a ground potential applied to the respective gate electrodes; and second depletion type MOSFETs coupled between said common source lines and said power supply potential and having said ground potential applied to their gate electrodes.

17. A read-only memory according to claim 16, wherein said first and second depletion type MOSFETs respectively cause potentials applied to said data and common source lines to be lowered to about 3.5 V or less.

18. A read-only memory according to claim 17, further comprising:
at least one first switching means wherein each is provided in correspondence with a predetermined plurality of said first and second depletion type MOSFETs, said first switching means being connected between said power supply potential and said plurality of first and second depletion type MOSFETs; and at least one second switching means corresponding in number to said first switching means so as being operationally associated with a first switching means so as to effect in their complementary operation, said second switching means being connected between said ground potential and said first and second depletion type MOSFETs.

19. A read-only memory according to claim 18, further comprising:

first selecting means for selecting said word lines in accordance with first address signals;

second selecting means for selecting said data lines and said common source lines in accordance with second address signals; and third selecting means for providing a control signal for controlling said first and second switching means, said control signal being provided in response to a chip select signal and a part of said second address signals such that, during a period of time when said read-only memory is selected, a predetermined potential which is lower than said power supply potential is applied to said data lines and common source lines through a corresponding one of said first switching means selected on the basis of a part of said second address signals, and wherein said ground potential is applied to other ones of said data lines and common source lines corresponding to other ones of said first switching means.

20. A read-only memory according to claim 19, wherein said first and second switching means comprise:
a CMOS logic inverter arrangement responsive to said control signal connected between said power supply potential and ground potential and having a common drain connection coupled to one of the source or drain electrodes of said depletion type MOSFETs.

21. A read-only memory comprising:
a memory array including a plurality of word lines, a plurality of data lines intersecting said word lines, a plurality of memory cells respectively provided at the intersections between said word lines and said data lines;

a dummy cell array including said word lines, a plurality of dummy data lines intersecting said word lines, and a plurality of dummy cells respectively provided at the intersections between said word lines and said dummy data lines;

first depletion type MOSFETs connected between said data lines and a power supply potential and having their gate electrodes biased by a ground potential and second depletion type MOSFETs being coupled between said dummy data lines and said power supply potential and having their gate electrodes biased by said ground potential.

22. A read-only memory according to claim 21, further comprising:
a sense amplifier having a pair of input notes coupled to said data lines and sensing data on said data lines read out from said memory cells, said sense amplifier including a first amplifying MOSFET coupled to one of said input nodes to supply a current to said data lines for said reading operation, and a second amplifying MOSFET coupled to the other input node to supply a current to said dummy data lines for reading out data from said dummy cells;

a depletion type MOSFET connected between said data lines and said first input node of said sense amplifier and having its gate electrode biased by said ground potential and a depletion type MOSFET connected between said dummy data lines and said second input node of said sense amplifier and having its gate electrode biased by said ground potential 23. A read-only memory according to claim 22, wherein said sense amplifier further includes a differential amplifier circuit having a pair of input nodes and first and second current mirrors having respective inputs and outputs, said first amplifying MOSFET defining an input-side MOSFET of said first current mirror, said second amplifying MOSFET defining an input-side MOSFET of said second current mirror, and the outputs of said first and second current mirrors being respectively supplied to said pair of input nodes of said differential amplifier circuit.

24. A read-only memory according to claim 21, wherein said memory array including common source lines, said dummy cell array includes at least one dummy common source line, and wherein each of said memory and dummy cells is an N-channel MOSFET, some of said memory cells having a threshold voltage which is made different from that of the other memory cells by ion implantation of an impurity carried out through their gate electrodes, the sources of at least said MOSFETs connected to the same one data line being connected to a common source line, and the sources of said MOSFETs connected to the same one dummy data line being connected to a dummy common source line.

25. A read-only memory according to claim 24, wherein said dummy cells are defined by first and second MOSFETs which are connected in parallel between said dummy data lines and said at least one dummy common source line, said first MOSFETs having a threshold voltage which is made substantially equal to that of some of said memory cells by ion implantation of an impurity carried out through their gate electrodes, the threshold voltage of said second MOSFETs being substantially equal to that of the other memory cells.

26. A read-only memory according to claim 24, further comprising:
third depletion type MOSFETs being coupled between said common source lines and said power supply potential and having their gate electrodes biased by said ground potential; and
at least one fourth depletion type MOSFET being coupled between said at least one dummy common source line and said power supply potential and having each respective gate electrode biased by said ground potential 27. A read-only memory according to claim 26, further comprising:
at least one first switching means wherein each is provided so as to correspond with a predetermined plurality of said first and third depletion type MOSFETs, each of said first switching means being connected between said power supply potential and said plurality of first and third depletion type MOSFETs; and
at least one second switching means corresponding in number to said first switching means and each second switching means being operationally associated with a first switching means so as to effect in their complementary operation, said second switching means being connected between said ground potential and said first and third depletion type MOSFETs;
at least one third switching means connected between said power supply potential and said second and fourth depletion type MOSFETs; and
at least one fourth switching means corresponding in number to said third switching means and each third switching means being operationally associated with a fourth switching means so as to effect in their complementary operation, said fourth switching means being connected between said ground potential and said second and fourth depletion type MOSFETs;
whereby, during a period of time when said read-only memory is selected and during a period of time when it is not selected, a predetermined potential lower than said power supply potential and a potential at said ground potential are applied to said dummy data lines and to said at least one dummy common source line, respectively.

28. A read-only memory according to claim 27, wherein said first and second switching means and said third and fourth switching means comprise first and second CMOS logic inverters, respectively, each being responsive to a control signal effected by a selection circuit responsive to a chip select signal and a predecoding signal, said CMOS inverters being coupled between said power supply potential and ground potential and having a common drain connection coupled to one of the source and drain electrodes of said depletion type MOSFETs.

* * * * *